United States Patent [19]
Koga et al.

[11] 3,992,664
[45] Nov. 16, 1976

[54] METHOD FOR MEASURING PARAMETERS OF QUARTZ CRYSTAL UNIT AND A NON-REACTIVE CONSTANT RESISTANCE ELEMENT FOR CARRYING OUT THE SAME

[75] Inventors: Issac Koga; Isao Okamoto; Shigeo Kobayashi, all of Tokyo, Japan

[73] Assignee: Kokusai Denshin Denwa Kabushiki Kaisha, Tokyo, Japan

[22] Filed: Dec. 8, 1975

[21] Appl. No.: 638,914

[30] Foreign Application Priority Data
Dec. 24, 1974 Japan.................................. 50-455
Dec. 24, 1974 Japan.................................. 50-456

[52] U.S. Cl................................. 324/56; 324/57 Q
[51] Int. Cl.² .................. G01R 29/22; G01R 23/00
[58] Field of Search ................ 324/56, 57 Q, 81, 82

[56] References Cited
UNITED STATES PATENTS
3,832,631 8/1974 Koga et al............................ 324/56
3,872,385 3/1975 Koga et al............................ 324/56

*Primary Examiner*—Gerard R. Strecker
*Attorney, Agent, or Firm*—Armstrong, Nikaido & Wegner

[57] ABSTRACT

The present invention discloses a method of constructing a non-reactive high frequency constant resistance unit to be used for measuring parameters of quartz crystal units described in U.S. Pat. No. 3,832,631 and U.S. Pat. No. 3,872,385. First, a non-reactive frequency of a crystal unit A is determined, a radio-frequency current is supplied to the series circuit A+B composed of said crystal unit A and a circuit B which is adjustable to non-reactiveness, and the circuit B is adjusted so that the phase of the terminal voltage across said series circuit A+B coincides with the phase of the terminal voltage across the circuit B. Next, said crystal unit A is replaced by an element $\overline{A}$, whose construction is similar to the said circuit B, and is adjustable to non-reactiveness, and the element $\overline{A}$ is adjusted so that the phase of the terminal voltage across said series circuit $\overline{A}$+B coincides with the phase of the terminal voltage across the circuit B. Lastly, the construction of $\overline{A}$ is fixed, whereby said element $\overline{A}$ is always available as a substitute for A, for checking the non-reactiveness of the circuit B.

6 Claims, 6 Drawing Figures

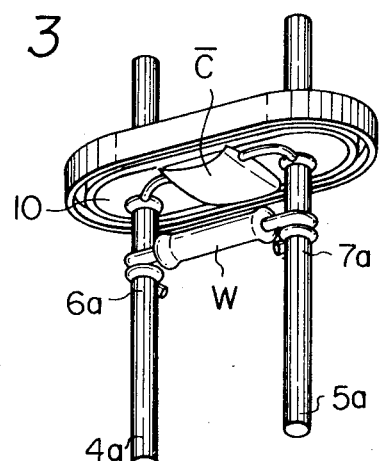
Fig. 3
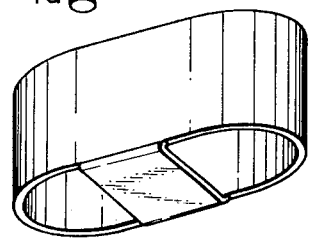
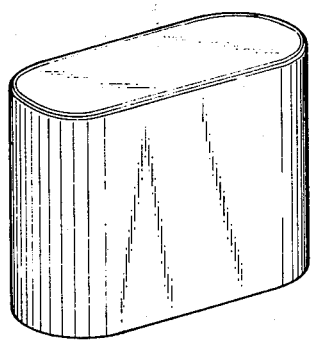
Fig. 4
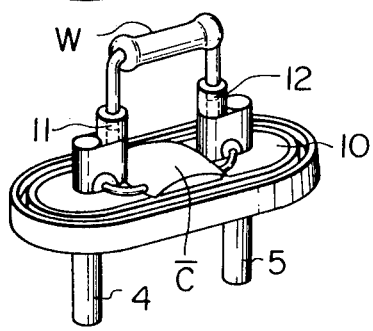

METHOD FOR MEASURING PARAMETERS OF QUARTZ CRYSTAL UNIT AND A NON-REACTIVE CONSTANT RESISTANCE ELEMENT FOR CARRYING OUT THE SAME

The present invention relates to an improvement of U.S. Pat. Nos. 3,832,631 and 3,872,385, which provide a method and fixture for measuring parameters of quartz crystal units and especially for simply and precisely measuring the non-reactive frequency and resistance of a quartz crystal unit of a very high frequency (VHF) range.

An object of the present invention is to provide a method and embodiment of an element which is purely non-reactive and whose resistance value is virtually constant at 125 MHz and at the frequencies lower than 125 MHz, in order to make the measurement much simpler and easier than heretofore.

Further features and advantages of the present invention will be apparent from the ensuing description with reference to the accompanying drawings to which, however, the scope of the invention is in no way limited.

FIGS. 3 and 4 are other embodiments of the non-reactive constant resistance element for carrying out the method according to the present invention.

We have explained, in the article published in the Journal of the Institute of Electronics and Communication Engineers of Japan, Vol. 53-A, No. 6, pp. 265–273, June, 1970, that a unit, which is purely non-reactive and whose resistance value is known, is realizable in an HF and VHF range. In other words, the non-reactive frequency and resistance of a crystal unit is determined by means of the "Center Line Method" published in said article.

Figure 1:
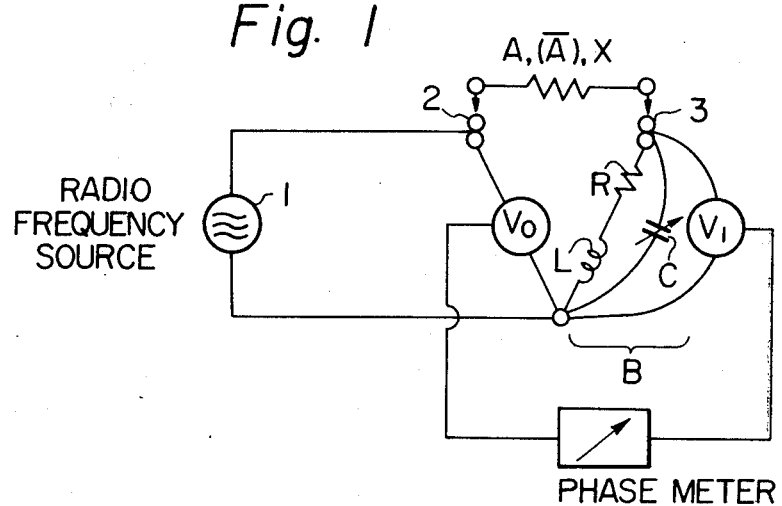
FIG. 1 shows one embodiment of a circuit for realizing the method for measuring the parameters of quartz crystal units according to the present invention.

Attention must be paid to the fact that the non-reactive frequency of a crystal unit is dependent upon its temperature and current. Therefore, the adjustment of a circuit which is adjustable to non-reactiveness must be carried out by using said crystal unit at a specific temperature and also at a specific current at which its non-reactive frequency and resistance were previously determined. Accordingly, the following adjustment, as shown in FIG. 1, is to be carried out. That is, by connecting the above-mentioned purely non-reactive crystal unit, indicated as A, in series with a circuit B, which is adjustable so as to become non-reactive, and supplying a radio frequency current to the series circuit of unit A and circuit B, (say A+B), circuit B is to be adjusted so that the phase of the terminal voltage across said series circuit A+B coincides with the phase of the terminal voltage across the circuit B, by observing the above-mentioned phase relation with an instrument such as a vector voltmeter 8405A, manufactured by Hewlett Packard Co. As the result of this adjustment the circuit B becomes non-reactive and the following relation holds at $f_o$.

$$L/C = R^2 + (2\pi f_o L)^2 \qquad (1)$$

where $f_o$ is the non-reactive frequency of the crystal unit A, $R$ is the DC resistance of the resistor in the circuit B, $L$ is the stray inductance of the resistor $R$, and $C$ is the capacitance of the variable capacitor including the capacitance of the voltmeter $V_1$.

Since $(2\pi f_o L)^2$ is negligible compared with $R^2$, the Equation (1) can be transformed as follows:

$$\left. \begin{array}{l} \dfrac{L}{C} = R^2, \\[4pt] \text{or} \\[4pt] R \cdot 2\pi f_o C = 2\pi f_o L/R \end{array} \right\} \qquad (2)$$

and the radio frequency resistance $\hat{R}$ of the circuit B at any frequency $f$, which is lower than $f_o$, is shown by the following equation.

$$\hat{R} = R\left[1 + \left(\dfrac{2\pi f_o L}{R}\right)^2 \left(\dfrac{f}{f_o}\right)^2\right] \qquad (3)$$

When, in Equation (3), $(2\pi f_o L)^2$ is very small and is negligible compared to $R^2$, $\hat{R}$ at $f$ or at the frequencies lower than $f_o$ is always virtually equal to the DC resistance $R$. However, in order for the circuit B be non-reactive, Equation (2) should also be satisfied. As $C$ includes the capacitance of the voltmeter $V_1$, the value of $C$ can not be reduced beyond a certain limit.

When the voltmeter $V_1$ is to be replaced by another voltmeter, or when the capacitance $C$ of the circuit B is to be readjusted for any reason, the circuit B should be readjusted by maintaining series circuit A+B at the same temperature where the non-reactive frequency of the crystal A has been determined. This process is very cumbersome. In the present invention, the complexity of this method can be completely obviated.

Figure 2A:
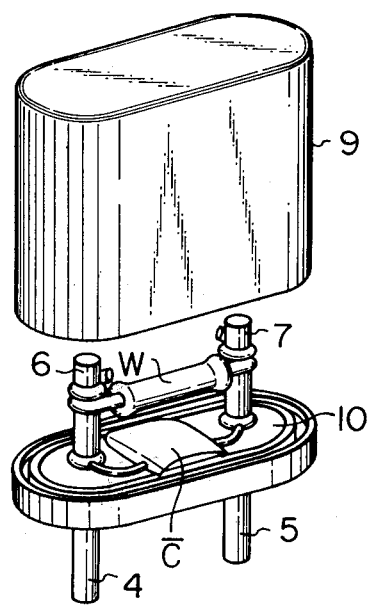
FIGS. 2A through 2C show one embodiment of the non-reactive constant resistance element for carrying out the method according to the present invention.
Figure 2B:
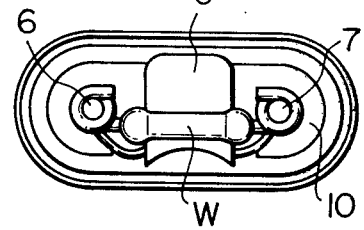
Figure 2C:
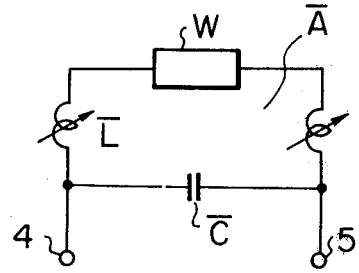

The characteristic feature of the present invention is that unit $\overline{A}$, of the same circuit construction as the circuit B, that is, composed of resistance W, stray inductance $\overline{L}$ and parallel capacitance $\overline{C}$, as shown in FIG. 2C, is connected to the terminals 2 and 3 in place of the crystal unit A. A high frequency current at the frequency $f_o$ is supplied to the series circuit $\overline{A}$+B, and the value of $\overline{C}$ or $\overline{L}$ is adjusted so that the phase of the voltage across the circuit $\overline{A}$+B coincides with the phase of the voltage across the circuit B. By the above-mentioned adjustment, the unit $\overline{A}$ becomes completely non-reactive at any frequency $f$ below $f_o$. If the values of $\overline{C}$ and $\overline{L}$ are very small, the high frequency resistance of the unit $\overline{A}$ is virtually equal to W at any frequency $f$ below $f_o$. In order that the increment of the high frequency resistance of the unit $\overline{A}$ at any frequency up to $f_o$ (=125 MHz) be less than 1% of DC resistance W (=50Ω), the following relation must be maintained, referring to Equations (2) and (3).

$$\left. \begin{array}{l} (2\pi f_o \overline{L}/W)^2 = (2\pi f_o \overline{C} \cdot W)^2 < 0.01 = (0.1)^2 \\[4pt] \text{or} \\[4pt] \overline{C} < \dfrac{0.1}{2\pi \times 125 \times 10^6 \times 50} = \dfrac{8}{\pi} \times 10^{-12} F \approx 2.5 \ pF \end{array} \right\} \qquad (4)$$

In view of this result, a fixed capacitor of 2.0 pF is used in the embodiment shown in FIGS. 2A through 2C, FIG. 3 and FIG. 4.

FIGS. 2A through 2C are drawings showing one embodiment of the construction of unit $\overline{A}$. A pair of metal columns, which are parallel to each other, are fixed to a base plate 10 which is composed of an electric insulating material. On one side of said base plate 10, said pair of the metal columns constitute the terminals 4 and 5 for insertion into the sockets 2 and 3 shown in FIG. 1. On the other side of said base plate 10, said pair of the metal columns constitute the columns 6 and 7 to be connected to the unit $\overline{A}$.

Referring again to FIGS. 2A through 2C, the lead wires of a high frequency fixed capacitor $\overline{C}$ are soldered to the lowest end of the columns 6 and 7, and a high frequency fixed resistor W is connected between said terminals 6 and 7. When the resistor W is connected between the terminals 6 and 7, the two lead wires of the resistor W are lightly wound around the columns 6 and 7 so that said resistor can be slid up and down, while maintaining the electric conductivity between said resistor W and said columns 6 and 7, thereby adjusting the stray inductance which exists in series with the resistor W, as shown in the equivalent circuit of FIG. 2C. Next, the terminals 4 and 5 are inserted into the sockets 2 and 3 shown in FIG. 1. The resistor W is slid up and down so as to seek the position where the phase of the terminal voltage across the circuit $\overline{A+B}$ coincides with the phase of the terminal voltage across the circuit B at the frequency $f_o(=125\text{MHz})$ (if necessary, after temporarily covering the circuit $\overline{A+B}$ with the cover 9), that is, the position whereat the impedance of the element $\overline{A}$ becomes non-reactive. When said position is found, the lead wires of the resistor W, which have been loosely wound around the columns 6 and 7, are soldered or fixed in any other way at said position. With this action the construction of the unit $\overline{A}$ is finished.

The construction shown in FIG. 2A can be modified as shown in FIG. 3 and FIG. 4. In the construction shown in FIG. 3, the order of the base plate 10, the high frequency fixed capacitor $\overline{C}$ and the high frequency resistor W, relative to said pairs of the metal columns are inverted with respect to FIG. 2A, and two terminals 4a and 5a are at the extreme ends of two columns 6a and 7a, respectively.

In the construction shown in FIG. 4, instead of the columns 6 and 7 in FIG. 2A, tubular columns 11 and 12 are rigidly fixed to the terminals 4 and 5 electrically and mechanically. The end of the lead wires of the resistor W are inserted into the tubular columns 11 and 12 and the stray inductance of the resistor W is adjusted by sliding said lead wires into the tubular columns 11 and 12. When the proper position of the resistor is found, the lead wires are soldered or fixed in any other way to the tube at their positions.

When the fixed capacitor $\overline{C}$ and the fixed resistor W are placed near the base plate 10, the value of the non-reactive resistance of the entire unit $\overline{A}$ is virtually the same value as the DC resistance. As the values of the constituent elements of the unit $\overline{A}$ and the circuit B are practically independent of the ambient temperature and the current supplied to the unit $\overline{A}$ and circuit B, the adjustment can be performed at any current and ambient temperature.

Once this combination of $\overline{A+B}$ (hereinafter called measuring set S) is completed, the non-reactive frequency and resistance of any other crystal unit X can be measured by using said measuring set S. In other words, firstly, the unit $\overline{A}$ is inserted into the sockets 2 and 3 shown in FIG. 1, the radio frequency current is supplied to the series circuit $\overline{A+B}$, and the value of C in the circuit B is adjusted so that the phase of the terminal voltage across the circuit $\overline{A+B}$ coincides with the phase of the terminal voltage across the circuit B. Secondly, the unit $\overline{A}$ is replaced by a crystal unit X to be tested. When the frequency of the radio frequency current is adjusted so that the phase of the terminal voltage across the circuit X+B coincides with the phase of the terminal voltage across the circuit B, then the frequency is the non-reactive frequency of the crystal unit X, and the non-reactive resistance of the crystal unit X is determined from the relation between the terminal voltages across X+B and across the circuit B.

When a new measuring set S together with its new unit $\overline{A}$ is required, it is preferable to at first adjust, at a certain temperature, the circuit B of the new measuring set S by using a crystal unit which is determined to be nonreactive at said certain temperature and at a certain frequency in the range of 125 MHz by means of a previous measuring set S. After that the new unit $\overline{A}$ for this new measuring set S is constructed at any room temperature, by taking advantage of the fact that the circuit B is non-reactive and the non-reactiveness of circuit B is, unlike a crystal unit, not sensitive to the temperature change.

What is claimed is:
1. A method of measuring the parameters of crystal units comprising the steps of
   a. determining the non-reactive frequency and the non-reactive resistance of a crystal unit A which is of the highest frequency selected from a plurality of crystal units to be tested,
   b. applying radio frequency voltage to the series circuit A+B composed of the crystal unit A and a circuit B which is adjustable to non-reactive resistance at a frequency range including the non-reactive frequency of the crystal unit A,
   c. adjusting the circuit B to non-reactiveness so that the phase of the voltage across the series circuit A+B and the phase of the voltage across the circuit B coincide,
   d. placing, in the position of said crystal unit A, a unit $\overline{A}$ which is composed of a parallel connection of a high frequency fixed capacitor and a high frequency fixed resistor having a stray inductance with adjustable lengths of lead wires and which is, as a whole, adjustable to a non-reactive constant resistance unit,
   e. applying a non-reactive frequency voltage of said crystal unit A to the series circuit $\overline{A}$+B,
   f. adjusting said stray inductance so that the phase of the voltage across said series circuit $\overline{A}$+B coincides with the phase of the voltage across the circuit B and, therefore, said unit $\overline{A}$ becomes a non-reactive constant resistive element, the resistance of which is virtually equal to its DC resistance, and the resistance of B is given by the relation between the voltages across the series circuit $\overline{A}$+B and the circuit B,
   g. replacing said unit $\overline{A}$ by a crystal X which is selected from the remainder of said plurality of crystal units,
   h. adjusting the frequency of applied voltage so that the phase of voltage across the series circuit X+B coincides with the phase of voltage across the circuit B,
   i. adopting the reading of frequency thus adjusted as the non-reactive frequency of the crystal unit X, or determining the non-reactive resistance of said crystal unit X from the relation between the voltages across the series circuit X+B and the circuit B in a non-reactive condition and thereafter, j. using said non-reactive constant resistive element (unit $\overline{A}$) in place of said crystal unit A.

2. A method of measuring parameters of crystal units according to claim 1, wherein said unit $\overline{A}$ comprises:
  a base plate which is composed of an electric insulating material;
  a pair of parallel metal columns which are fixed to said base plate;
  a pair of terminals which are the extension of said metal columns on one side of said base plate;
  a fixed capacitor the lead wires thereof being connected to said metal columns at a position near said base plate;
  a fixed resistor which is connected in parallel to said fixed capacitor, the lead wires of said fixed resistor being connected to said metal columns and a stray inductance of said fixed resistor is adjusted by adjusting the distance of said fixed resistor from said base plate.

3. A unit $\overline{A}$ as claimed in claim 2, wherein the lead wires of said fixed capacitor are fixed to said metal columns, the lead wires of said fixed resistor are wound around said metal columns and fixed to said metal columns after adjusting the distance between said fixed resistor and said base plate.

4. A unit $\overline{A}$ as claimed in claim 2, wherein said terminals exist on the opposite side to said capacitor with reference to said base plate.

5. A unit $\overline{A}$ as claimed in claim 2, wherein said terminals exist on the same side as said capacitor with reference to said base plate.

6. A unit $\overline{A}$ as claimed in claim 2, wherein tubular metal columns are fixed to said metal columns, the lead wires of said fixed capacitor are fixed to said tubular metal columns and the lead wires of said fixed resistor are inserted into said tubular metal columns and fixed to said tubular metal columns after adjusting the distance between said fixed capacitor and said base plate.

* * * * *